United States Patent
Sato (10) Patent No.: US 10,068,783 B2
(45) Date of Patent: Sep. 4, 2018

(54) SAMPLE HOLDER

(71) Applicant: KYOCERA Corporation, Kyoto-shi, Kyoto (JP)

(72) Inventor: Masahiro Sato, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 252 days.

(21) Appl. No.: 14/893,417

(22) PCT Filed: Jun. 27, 2014

(86) PCT No.: PCT/JP2014/067155
§ 371 (c)(1),
(2) Date: Nov. 23, 2015

(87) PCT Pub. No.: WO2015/029575
PCT Pub. Date: Mar. 5, 2015

(65) Prior Publication Data
US 2016/0126117 A1 May 5, 2016

(30) Foreign Application Priority Data

Aug. 26, 2013 (JP) ................................ 2013/174348

(51) Int. Cl.
*H01L 21/67* (2006.01)
*H01L 21/683* (2006.01)
(Continued)

(52) U.S. Cl.
CPC ........ *H01L 21/67103* (2013.01); *C30B 25/18* (2013.01); *C30B 29/06* (2013.01);
(Continued)

(58) Field of Classification Search
CPC ......... H01L 21/67103; H01L 21/67282; H01L 21/6835; H01L 21/67109; H01L 21/67288; H01L 21/6857; C30B 25/18; C30B 29/06
See application file for complete search history.

(56) References Cited

U.S. PATENT DOCUMENTS

| | | | |
|---|---|---|---|
| 6,639,783 B1 * | 10/2003 | Shamouilian | H02N 13/00 279/128 |
| 2003/0044653 A1 * | 3/2003 | Hiramatsu | B32B 18/00 428/704 |
| 2011/0058303 A1 | 3/2011 | Migita | |

FOREIGN PATENT DOCUMENTS

JP 03-108737 A 5/1991
JP 2005-347400 A 12/2005
(Continued)

OTHER PUBLICATIONS

Extended European Search Report, European Patent Application No. 14840632.5, Mar. 14, 2017, 7 pgs.
(Continued)

*Primary Examiner* — Zeev V Kitov
(74) *Attorney, Agent, or Firm* — Volpe and Koenig, P.C.

(57) ABSTRACT

A sample holder of the present invention includes a base body formed of ceramic substrates laminated to each other and having an upper surface functioning as a sample holding surface. In this sample holder, the base body includes a first ceramic substrate including a flow path for a heating medium and a second ceramic substrate which is laminated at an upper side than the first ceramic substrate, which has an upper surface functioning as the sample holding surface, and which is formed of the same material as that of the first ceramic substrate, and the average grain diameter of ceramic
(Continued)

grains forming the second ceramic substrate is smaller than that of ceramic grains forming the first ceramic substrate.

7 Claims, 4 Drawing Sheets

(51) Int. Cl.
    *H01L 21/687* (2006.01)
    *C30B 25/18* (2006.01)
    *C30B 29/06* (2006.01)

(52) U.S. Cl.
    CPC .. *H01L 21/67109* (2013.01); *H01L 21/67288* (2013.01); *H01L 21/6835* (2013.01); *H01L 21/68757* (2013.01)

(56) References Cited

FOREIGN PATENT DOCUMENTS

| | | |
|---|---|---|
| JP | 2010-114416 A | 5/2010 |
| JP | 2012-129539 A | 7/2012 |
| WO | 2013/051713 A1 | 4/2013 |

OTHER PUBLICATIONS

International Search Report (Form PCT/ISA/210) dated Sep. 22, 2014 and issued for International Application No. PCT/JP2014/067155.
Japanese Office Action with English concise explanation, Japanese Patent Application No. 2015-534057, dated Aug. 2, 2016, 5 pgs.

* cited by examiner

SAMPLE HOLDER

TECHNICAL FIELD

The present invention relates to a sample holder which is used, for example, in a process for manufacturing semiconductor integrated circuits or a process for manufacturing liquid crystal devices. The sample holder is used when a sample, such as a semiconductor wafer or a glass substrate, is held.

BACKGROUND ART

After a plate-shaped sample, such as a semiconductor wafer, e.g. a silicon wafer, used for manufacturing semiconductor integrated circuits or a glass substrate used for manufacturing liquid crystal devices, is held on a support stage of a manufacturing apparatus or an inspection apparatus in a manufacturing process, for example, a processing treatment or an inspection is performed on the sample. In the manufacturing process, since a plurality of manufacturing apparatuses and inspection apparatuses are generally used, as a device configured to hold a sample, such as silicon wafer, on a support stage, various types of devices have been proposed in accordance with the types of manufacturing apparatuses and inspection apparatuses used in a manufacturing process and the types of transport apparatuses transporting a sample to the following apparatus.

For example, in the case of a semiconductor integrated circuit, in recent years, the semiconductor integrated circuit has been increasingly required to be more finely designed and to have a higher density. In concomitance with this requirement, a sample holder is further required to improve the thermal uniformity of a surface thereof which holds a sample. In addition, in recent years, in order to perform wiring pattern processing having a high aspect ratio on a semiconductor wafer, it has been required to apply a high frequency wave to a sample holder. In concomitance with this requirement, the sample holder is required to improve the withstand voltage.

Japanese Unexamined Patent Application Publication No. 3-108737 (hereinafter referred to as "Patent Document 1" in some cases) has disclosed an electrostatic chuck formed of a plurality of ceramic layers, and in this electrostatic chuck, a flow path which allows a cooling medium to flow therethrough is formed in an intermediate ceramic layer. When the balance between heating and cooling is controlled at each portion by this structure, the thermal uniformity of the surface of the electrostatic chuck can be improved.

However, in the electrostatic chuck disclosed in Patent Document 1, it has been difficult to further improve the thermal uniformity while the strength in the vicinity of the surface which holds a sample is maintained. In particular, as a method to improve the thermal uniformity of the surface which holds a sample, an improvement in thermal conductivity of the ceramic layer has been conceived. However, in order to improve the thermal conductivity of the ceramic layer, when the average grain diameter of ceramic grains thereof is increased, since the gap between grain boundaries is increased, the strength of the ceramic layer may be decreased in some cases. As a result, the strength in the vicinity of the surface which holds a sample may be degraded in some cases. Accordingly, for example, by a pressure to be applied during assembly and/or a thermal stress generated under heat cycle conditions, the ceramic layer may be damaged in some cases. In addition, when a high frequency wave is applied to the electrostatic chuck, if the average grain diameter of the ceramic grains is large, the gap between grain boundaries is increased, so that electricity is liable to pass through the grain boundaries. As a result, breakdown of the ceramic layer may occur in some cases.

On the other hand, in order to increase the strength in the vicinity of the surface which holds a sample, when the average grain diameter of the ceramic grains of the ceramic layer is decreased, the number of interfaces between the grains is increased, so that the thermal conductivity may be degraded in some cases. As a result, the thermal uniformity of the surface which holds a sample may be degraded in some cases.

SUMMARY OF INVENTION

A sample holder according to one aspect of the present invention is a sample holder comprising a base body which is formed of ceramic substrates laminated to each other and which has an upper surface functioning as a sample holding surface. The base body described above includes a first ceramic substrate including a flow path for a heating medium and a second ceramic substrate which is laminated at an upper side than the first ceramic substrate, which has an upper surface functioning as the sample holding surface, and which is formed of the same material as that of the first ceramic substrate, and the average grain diameter of ceramic grains forming the second ceramic substrate is smaller than the average grain diameter of ceramic grains forming the first ceramic substrate.

DESCRIPTION OF EMBODIMENTS

Figure 1A:
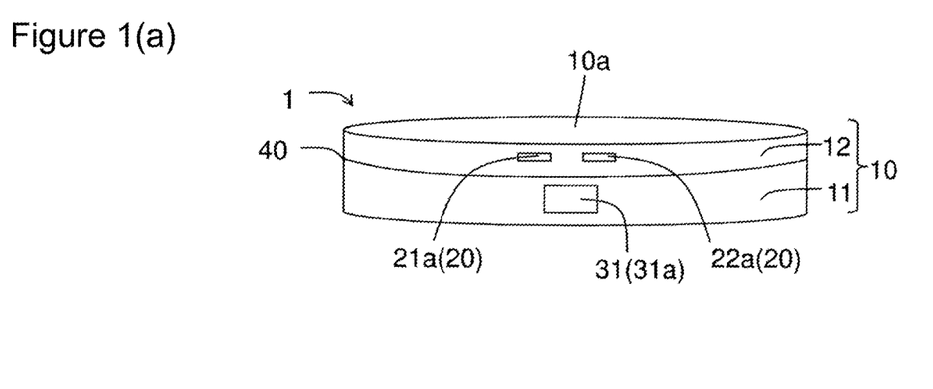
FIGS. 1(a) and 1(b) are views each showing the appearance of a sample holder which is one example of an embodiment of the present invention.
Figure 1B:
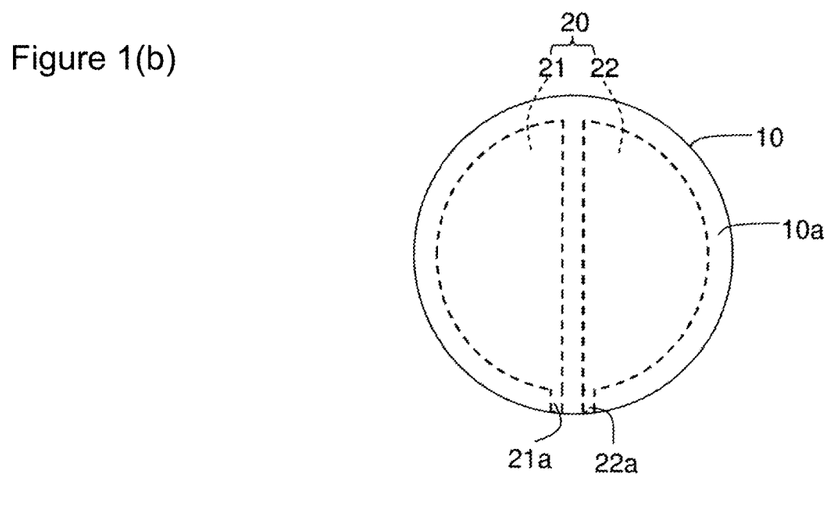

FIG. 1 includes views each showing the appearance of a sample holder 1 which is one example of an embodiment of the present invention. FIG. 1(a) is a perspective view of the sample holder 1, and FIG. 1(b) is a plan view of the sample holder 1.

The sample holder 1 comprises: a base body 10 having an upper surface functioning as a sample holding surface 10a; and an electrode 20 provided in the base body 10.

The base body 10 is formed of a first ceramic substrate 11 including a flow path 31 for a heating medium and a second ceramic substrate 12 laminated at an upper side than the first ceramic substrate 11 and having an upper surface functioning as the sample holding surface 10a. In the second ceramic substrate 12, the electrode 20 is embedded. This sample holder 1 is used to hold a sample, such as a silicon wafer, on the sample holding surface 10a using an electrostatic force by applying the voltage to the electrode 20 provided in the second ceramic substrate 12.

In this embodiment, the first ceramic substrate 11 and the second ceramic substrate 12 of the base body 10 are each formed of a laminate in which ceramic layers are laminated to each other. In the first ceramic substrate 11 of the base body 10, the flow path 31 which allows a heating medium to flow therethrough is provided. When the heating medium is allowed to flow through the flow path 31, the sample holder 1 is able to increase, decrease, or maintain the temperature of a sample held on the sample holding surface 10a. As the heating medium which is allowed to flow through the flow path 31, any type of heating medium may be used as long as capable of performing a heat exchange with a sample held on the sample holding surface 10a through the flow path 31 of the first ceramic substrate 11. As the heating medium as described above, various types of fluids, such as water-based media including hot water, cold water, and steam, organic-based media including ethylene glycol, or gases including air, may be used.

Figure 2:
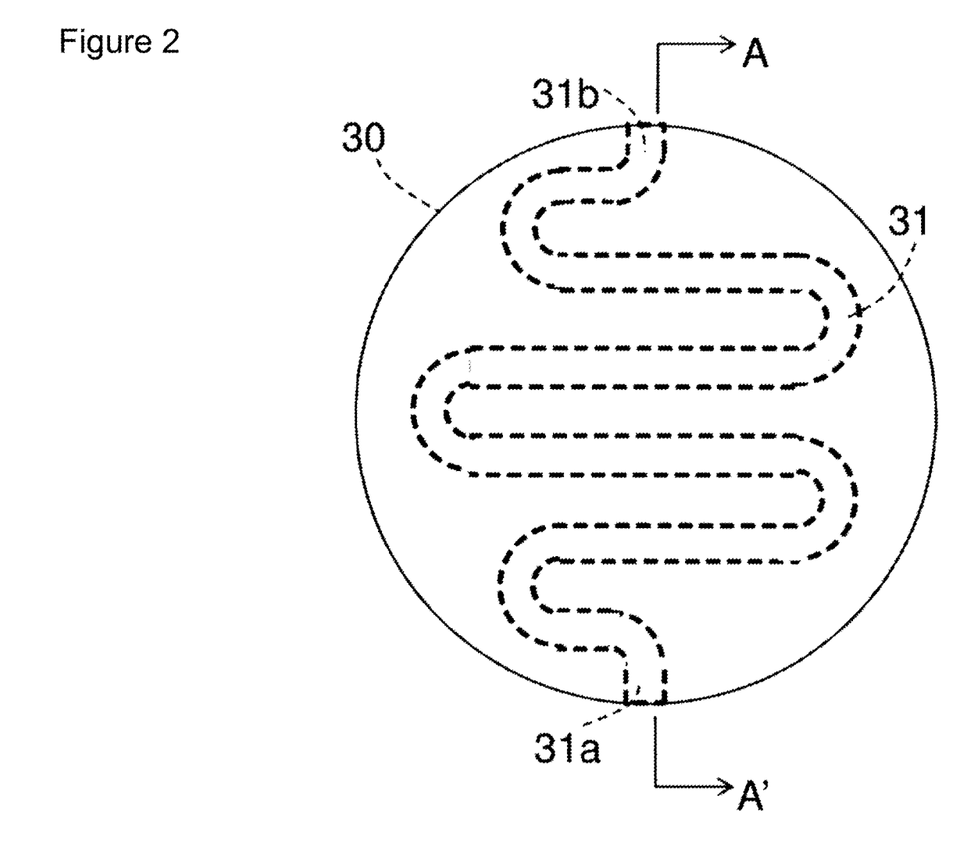
FIG. 2 is a schematic plan view showing the arrangement of a flow path in the sample holder.

As shown in FIG. 1(a), the flow path 31 has an opening portion 31a which is provided in an end surface of the first ceramic substrate 11 and which is open to an exterior space. In addition, as shown in FIG. 2, the flow path 31 also has an opening portion 31b which is provided in an end surface opposite to the opening portion 31a and which is open to an exterior space. The heating medium which flows through the flow path 31 is allowed to flow into the flow path 31 from the opening portion 31a functioning as a supply port and to discharge out of the opening portion 31b opposite to the opening portion 31a. When the sample holder 1 is used for a semiconductor manufacturing apparatus, an inspection apparatus, or the like, a supply pipe extending from a supply apparatus configured to supply the heating medium is connected to the opening portion 31a, and the heating medium is supplied into the flow path 31 from the supply apparatus at a predetermined flow rate and flow velocity. A discharge pipe is connected to the opening portion 31b opposite to the opening portion 31a, and the heating medium flowing through the flow path 31 and performing a heat exchange with a sample is discharged from the flow path 31. In addition, a return pipe may be connected to the opening portion 31b so that the heating medium flowing through the flow path 31 and performing a heat exchange with a sample is allowed to discharge from the flow path 31 and simultaneously is allowed to return to the supply apparatus for circulation.

In order to enable the heating medium flowing through the flow path 31 to efficiently perform a heat exchange with a sample held on the sample holding surface 10a, the flow path 31 is preferably formed in a wide area corresponding to the sample holding surface 10a. In addition, in view of the thermal uniformity over the entire sample holding surface 10a, it is important to form the flow path 31 in a wide area. Hence, in the sample holder 1 of this embodiment, as shown in FIG. 2, the flow path 31 from the opening portion 31a to the opening portion 31b located opposite thereto has a meandering shape so as to cover the entire sample holding surface 10a. When the flow path 31 is arranged as described above, the heat exchange with a sample to be held can be efficiently performed by increasing the width of the flow path 31 and/or by decreasing the curvature radius of a curved portion which enables the flow path 31 to meander. In addition, when the distance between linear segments of the meandering shape at a folding portion is excessively decreased, the thickness of a portion forming a side wall of the flow path 31 is decreased, and the mechanical strength thereof is decreased thereby; hence, the flow path 31 is preferably formed in consideration of the strength thereof.

In the example shown in FIG. 2, although the flow path 31 is formed to have a meandering shape, the shape of the flow path 31 is not limited thereto. For example, the flow path 31 may have a coil shape or a shape in which a plurality of concentric circles and linear lines extending in a diameter direction thereof to connect between the circles are used in combination.

The flow path 31 may have a square shape or a circular shape when viewed in cross-section perpendicular to the main surface of the base body 10. In particular, in view of manufacturing easiness, a square shape is preferable.

The first ceramic substrate 11 and the second ceramic substrate 12 are each formed of a ceramic (ceramic sintered body) containing as a primary component, silicon carbide, silicon nitride, aluminum nitride, aluminum oxide, or the like. In particular, for the first ceramic substrate 11 including the flow path 31, when a water-based solvent, such as purified water, is selected as the heating medium, among the ceramics mentioned above, a ceramic containing as a primary component, aluminum oxide or silicon carbide, each having a particularly excellent water resistance, is preferably used. In this embodiment, the first ceramic substrate 11 and the second ceramic substrate 12 are formed of the same material. Since the first ceramic substrate 11 and the second ceramic substrate 12 are formed of the same ceramic material (for example, a ceramic containing aluminum oxide as a primary component), the coefficient of thermal expansion of the first ceramic substrate 11 can be set close to that of the second ceramic substrate 12. As a result, a thermal stress generated between the first ceramic substrate 11 and the second ceramic substrate 12 can be reduced. In addition, the term "formed of the same material" used in this embodiment indicates the case in which 80% or more of the composition is the same.

The fact that the first ceramic substrate 11 and the second ceramic substrate 12 are formed of materials containing the same primary component can be confirmed by the following method. In particular, the confirmation can be performed by identifying the composition using a fluorescent x-ray analysis apparatus (ZSX100e manufactured by Rigaku Corp.) or by identifying the crystal phase using an x-ray diffraction method.

In particular, the first ceramic substrate 11 and the second ceramic substrate 12 are each preferably formed of a ceramic containing aluminum oxide as a primary component. Accordingly, the water resistance of the first ceramic substrate 11 and the second ceramic substrate 12 can be improved. As a result, a long term reliability of the sample holder 1 can be improved when a water-based medium is used as the heating medium.

In addition, in the sample holder 1 of this embodiment, the average grain diameter of ceramic grains forming the second ceramic substrate 12 is smaller than that of ceramic grains forming the first ceramic substrate 11.

As described above, when the average grain diameter of the ceramic grains forming the second ceramic substrate 12 is set smaller than that of the ceramic grains forming the first ceramic substrate 11, the size of defects generated in the second ceramic substrate 12 can be reduced. Furthermore, since the development of cracks can be suppressed by an increase in number of grain boundaries, the strength of the second ceramic substrate 12 can be improved. Accordingly, the strength in the vicinity of the sample holding surface 10a can be improved. In addition, the withstand voltage of the second ceramic substrate 12 can also be improved. As a result, the reliability of the sample holder 1 can be improved.

In addition, when the average grain diameter of the ceramic grains forming the first ceramic substrate 11 is set larger than that of the ceramic grains forming the second ceramic substrate 12, since the number of grain boundaries, which disturb the phonon conduction, can be reduced, the thermal conductivity of the first ceramic substrate 11 can be improved. As described above, when the thermal conductivity of the first ceramic substrate 11 including the flow path 31 can be improved, the temperature adjustment by the flow path 31 can be rapidly performed. As a result, the thermal uniformity of the sample holding surface 10*a* can be improved.

When the first ceramic substrate 11 and the second ceramic substrate 12 are each formed of aluminum oxide, the average grain diameter of the ceramic grains forming the first ceramic substrate 11 may be set, for example, to 3 to 20 µm. In addition, the average grain diameter of the ceramic grains forming the second ceramic substrate 12 may be set, for example, to 0.5 to 10 µm. In particular, the average grain diameter of the ceramic grains forming the first ceramic substrate 11 and the average grain diameter of the ceramic grains forming the second ceramic substrate 12 are preferably set to 5 to 15 µm and 0.5 to 5 µm, respectively. As a result, the sample holder 1 can be formed so as to rapidly perform temperature adjustment while the strength is increased.

In addition, when the first ceramic substrate 11 and the second ceramic substrate 12 are each formed of aluminum nitride, the average grain diameter of the ceramic grains is also preferably controlled as described above.

In addition, in this embodiment, although formed of the first ceramic substrate 11 and the second ceramic substrate 12, the base body 10 is not limited thereto. In particular, another ceramic substrate may be provided between the first ceramic substrate 11 and the second ceramic substrate 12.

In addition, in the first ceramic substrate 11 and the second ceramic substrate 12 formed of the same material, as a method to control the average grain diameter of the ceramic grains of each substrate, for example, a method to change a firing temperature may be mentioned. In particular, as described above, when the first ceramic substrate 11 and the second ceramic substrate 12 are each formed of a ceramic containing aluminum oxide as a primary component, the first ceramic substrate 11 may be formed by firing at 1,600° C. for 2 hours, and the second ceramic substrate 12 may also be formed by firing at 1,500° C. for 2 hours. In this case, as a starting raw material, an aluminum oxide powder having an average particle diameter of 1.5 µm and an impurity of 99.9% may be used. When the first ceramic substrate 11 is fired at a higher temperature than that for the second ceramic substrate 12, the growth of crystal grains in the first ceramic substrate 11 can be promoted. As a result, the average grain diameter of the ceramic grains of the first ceramic substrate 11 can be made different from the average grain diameter of the ceramic grains of the second ceramic substrate 12. In particular, in this example, the average grain diameter of the ceramic grains of the first ceramic substrate 11 is approximately 8 µm, and the average grain diameter of the ceramic grains of the second ceramic substrate 12 is approximately 5 µm.

In addition, as another method to control the average grain diameter of the ceramic grains of each ceramic substrate, there may be mentioned a method in which materials having different average particle diameters are used as raw materials which are before firing. In order to manufacture the first ceramic substrate 11 and the second ceramic substrate 12 as described above, for example, by using an aluminum oxide powder having an average particle diameter of 1.5 µm as a raw material for the first ceramic substrate 11 and an aluminum oxide powder having an average particle diameter of 1.0 µm as a raw material for the second ceramic substrate 12, firing may be performed at 1,500° C. for 2 hours. As a result, the ceramic grains of the first ceramic substrate 11 has an average grain diameter of approximately 5 µm, and the ceramic grains of the second ceramic substrate 12 has an average grain diameter of approximately 3 µm.

Again, with reference to FIG. 1, the electrode 20 is provided in the second ceramic substrate 12 and is formed of one electrode or two separated electrodes 21 and 22. The electrode 20 is an electrostatically adsorbing electrode provided for electrostatic adsorption of a sample to the sample holding surface 10*a*. One of the electrodes 21 and 22 is connected to a positive electrode of a power source, and the other electrode is connected to a negative electrode thereof. As one example, an electrode to be connected to the positive electrode is called the electrode 21 (hereinafter called "positive electrode 21"), and an electrode to be connected to the negative electrode is called the electrode 22 (hereinafter called "negative electrode 22"). Alternatively, in the electrode 20, the electrode 21 may be connected to the negative electrode, and the electrode 22 may be connected to the positive electrode.

The positive electrode 21 and the negative electrode 22 are each formed to have a semicircular shape and are arranged in the second ceramic substrate 12 so that the strings of the semicircular shapes face each other. The two electrodes, that is, the positive electrode 21 and the negative electrode 22, collectively form the entire electrode 20 having a circular outside shape. The center of the circular outside shape of this entire electrode 20 is set at the same position as the center of the circular outside shape of the second ceramic substrate 12.

The positive electrode 21 and the negative electrode 22 are provided with connection terminals 21*a* and 22*a*, respectively, which are each electrically connected to the outside power source. In this embodiment, the connection terminals 21*a* and 22*a* are provided for the positive electrode 21 and the negative electrode 22, respectively, so as to each extend along the string from a position at which the circular arc and the string intersect with each other. The connection terminal 21*a* provided for the positive electrode 21 and the connection terminal 22*a* provided for the negative electrode 22 are arranged adjacent to each other with the same gap therebetween as the gap between the string of the semicircular shape of the positive electrode 21 and the string of the semicircular shape of the negative electrode 22 and each extend to the outer circumference surface of the second ceramic substrate 12 along the extended line of the string of the semicircular shape of the electrode. In addition, the connection terminals 21*a* and 22*a* are each provided so as to be partially exposed to the end surface of the second ceramic substrate 12. The positive electrode 21 and the negative electrode 22 are connected to the outside power source through the exposed portions of the connection terminals 21*a* and 22*a*, respectively.

The electrode 20 is composed of an electrically conductive material, such as tungsten or molybdenum, and is formed from a paste containing the electrically conductive material mentioned above by screen printing or the like so as to be located between the layers of the second ceramic substrate 12. The thickness of the electrode 20 of this embodiment is, for example, approximately 1 to 100 µm.

Figure 3:
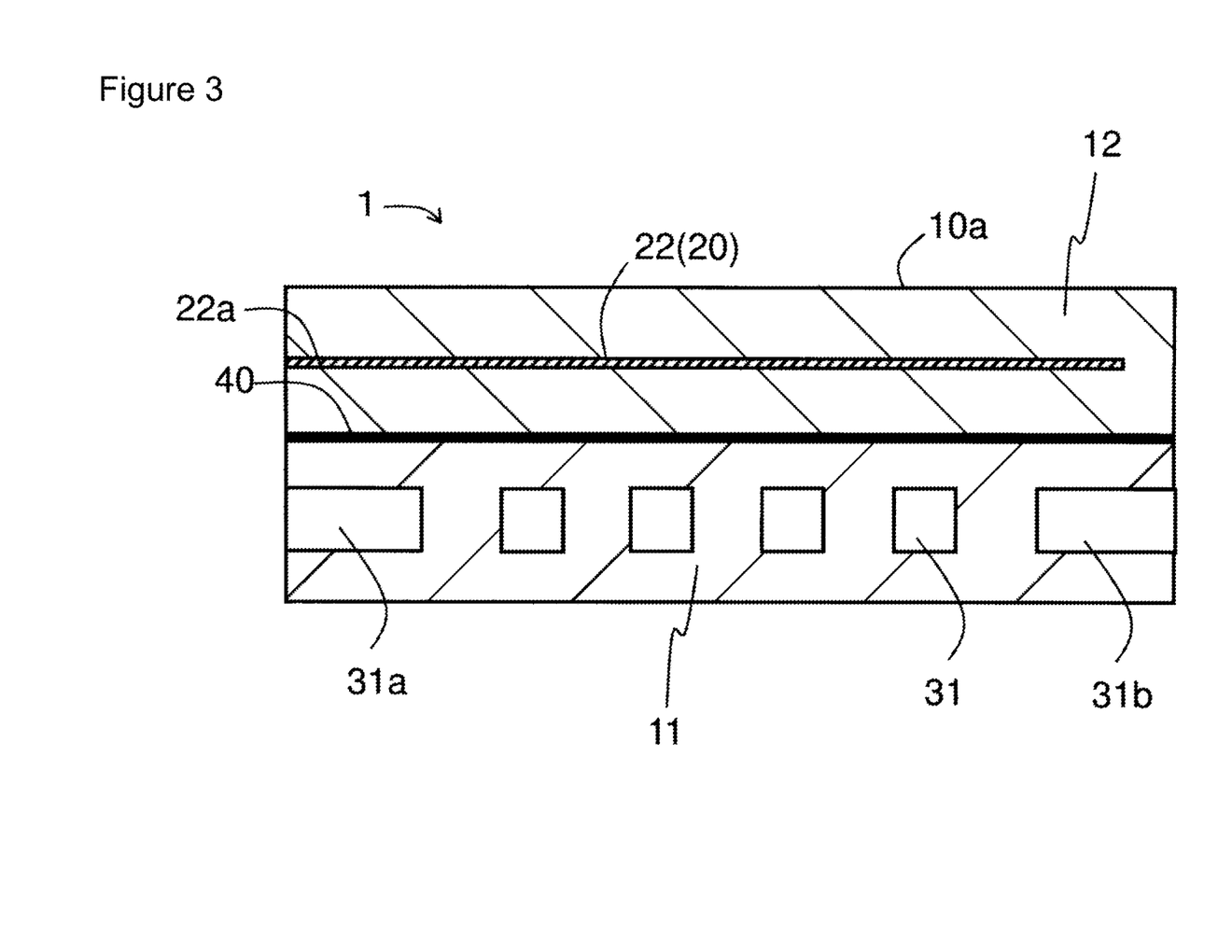
FIG. 3 is a cross-sectional view of the sample holder along the line A-A' shown in FIG. 2.

FIG. 3 is a cross-sectional view of the sample holder 1 along the line A-A' shown in FIG. 2. The second ceramic substrate 12 including the electrode 20 is bonded to the first ceramic substrate 11 including the flow path 31 with a bonding layer 40 interposed therebetween. As the bonding layer 40, for example, a resin material, such as a silicone or an epoxy, or a glass is used. As is the sample holder 1 of this embodiment, when the first ceramic substrate 11 and the second ceramic substrate 12 are formed of the same material, in view of the bonding strength and the heat resistance, a glass is preferably used for the bonding layer 40. The thickness of the bonding layer 40 may be set, for example, to 1 to 100 µm.

In addition, the present invention is not limited to the embodiment described above, and for example, various modifications and improvements may be performed without departing from the scope of the present invention. For example, although the appearance of the sample holder 1 of the above embodiment has a circular shape, the appearance thereof is not limited thereto. As long as capable of holding a sample with a sufficient holding force, a rectangular shape may be used, and any polygonal shape may also be used.

In addition, although the sample holder 1 of the above embodiment is a so-called electrostatic chuck including the electrode 20 functioning as an electrostatically adsorbing electrode, the sample holder 1 is not limited thereto. For example, the present invention may also be applied to a so-called vacuum chuck which holds a sample by vacuum adsorption without using the electrode 20. The vacuum chuck includes, instead of the electrode 20, a hole open to the sample holding surface 10a for vacuum adsorption and a vacuum pipe. When the structure described above is applied to a vacuum chuck, while the strength of the second ceramic substrate 12 is improved, the thermal conductivity of the first ceramic substrate 11 can be improved.

The average grain diameter of the ceramic grains forming the first ceramic substrate 11 and the average grain diameter of the ceramic grains forming the second ceramic substrate 12 can be measured by a cord method as described below. In particular, the first ceramic substrate 11 and the second ceramic substrate 12 are each partially cut out using a diamond cutter, and polishing processing was then performed using a diamond slurry. Subsequently, after thermal etching was performed at 1,300° C. for 2 hours, SEM observation is performed. On an image obtained by this SEM observation, a straight line having a length of 100 µm is drawn at a measurement portion, and the number of ceramic grains present on this straight line is counted. In addition, the average grain diameter is calculated by dividing 100 µm by the number of the grains.

Hereinafter, one example of a method for manufacturing the sample holder 1 of the present invention will be described.

As a starting raw material, an aluminum oxide powder having an average particle diameter of 1.5 µm and a purity of 99.9% is used. Subsequently, after this aluminum oxide powder is mixed with an organic binder and an organic solvent without adding a sintering auxiliary agent and is then dried at 60° C., particle size control is performed using mesh pass, so that a granulated powder is formed.

Next, this granulated powder is filled in a mold, and one disc-shaped molded body having a diameter of 60 mm and a thickness of 1 mm and three disc-shaped molded bodies each having the same diameter as described above and a thickness of 3 mm were formed at a molding pressure of 98 Mpa.

Subsequently, a groove corresponding to the flow path 31 is formed in one of the molded bodies having a thickness of 3 mm by cutting work. On the molded body thus processed by this cutting work, one molded body which has a thickness of 3 mm and which is not processed by the cutting work is arranged with an organic binder provided therebetween. This laminate is pressed at a molding pressure of 98 Mpa for close contact between the molded bodies.

Next, after degreasing is performed in a nitrogen atmosphere, firing is performed at 1,600° C. for 2 hours, so that a disc-shaped sintered body (first ceramic substrate 11 formed of an aluminum oxide sintered body) having a radius of 50 mm and a thickness of 5 mm is obtained. The top and the bottom surfaces of this sintered body are processed by surface grinding using a diamond stone, so that the sintered body is planarized.

Next, a paste of a tungsten powder is screen-printed on the remaining molded body having a thickness of 3 mm to form the electrode 20. The molded body having a thickness of 1 mm is arranged on the molded body described above and is brought into close contact therewith by press molding at a molding pressure of 98 MPa. Subsequently, after degreasing is performed in a nitrogen atmosphere, firing is performed at 1,500° C. for 2 hours, so that a disc-shaped sintered body (second ceramic substrate 12 formed of an aluminum oxide sintered body) having a radius of 50 mm and a thickness of 3 mm is obtained. The top and the bottom surfaces of this sintered body are processed by surface grinding using a diamond stone, so that the sintered body is planarized.

The two sintered bodies thus obtained (the first ceramic substrate 11 and the second ceramic substrate 12) are bonded to each other. For the bonding, a bonding layer 40 formed, for example, of a silicone resin may be used. The thickness of the bonding layer 40 formed of a silicone resin may be set, for example, to 50 µm. The bonding layer 40 may be formed, for example, by the following method. A silicone resin to be used as the bonding layer 40 is screen-printed on a bonding surface of the first ceramic substrate 11. Subsequently, a bonding surface of the second ceramic substrate 12 and the bonding surface of the first ceramic substrate 11 are adhered to each other with the silicone resin interposed therebetween. Next, while the first ceramic substrate 11 and the second ceramic substrate 12 are placed in a fixed state using a vice, those substrates are held in an atmosphere at 100° C. for 2 hours using a drying machine, so that the silicone resin is cured. As described above, the bonding layer 40 is formed.

As described above, the sample holder 1 can be manufactured.

Figure 4:
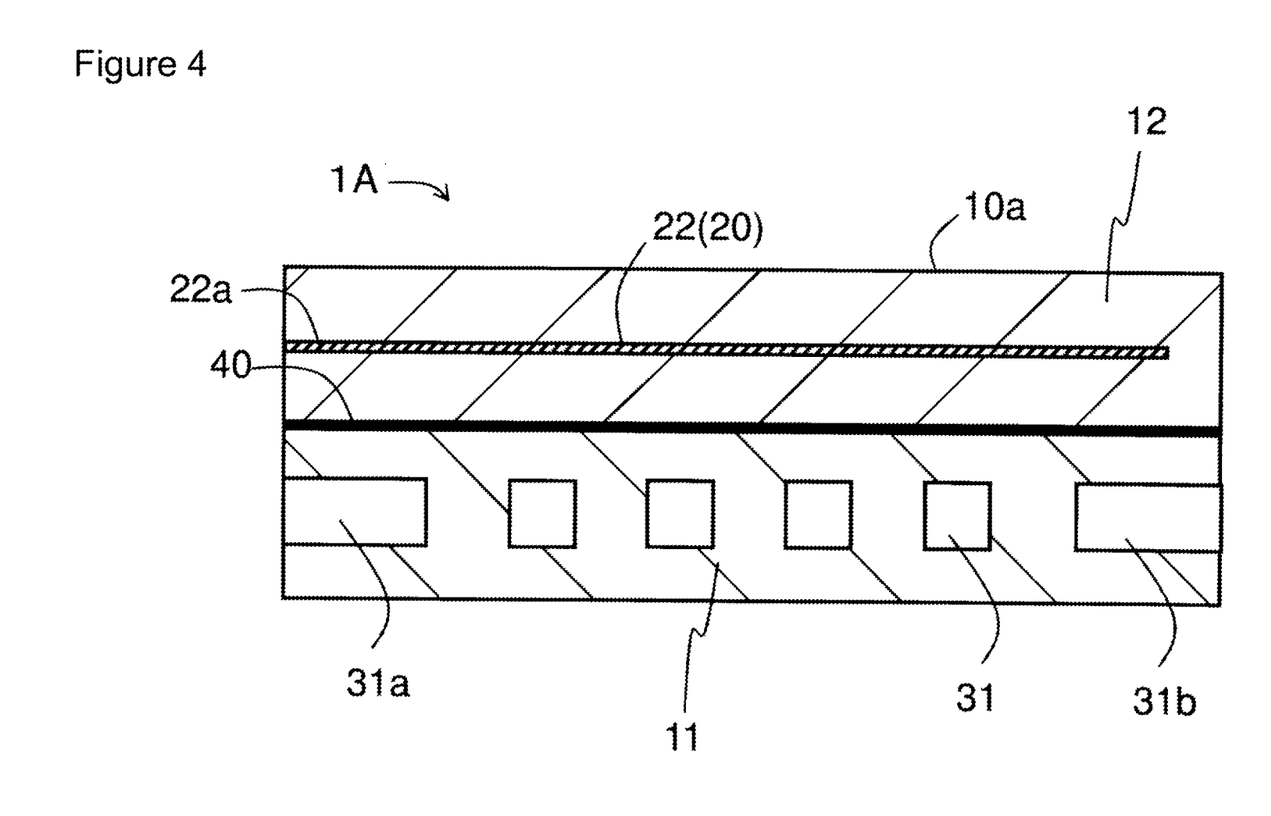
FIG. 4 is a cross-sectional view showing a sample holder of another embodiment.

Next, a sample holder 1A of another embodiment will be described. Although the sample holder 1A of the another embodiment has approximately the same structure as that of the sample holder 1 described above, the relationship in size between the average grain diameter of the ceramic grains of the first ceramic substrate 11 and the average grain diameter of the ceramic grains of the second ceramic substrate 12 is different.

In particular, in the sample holder 1A of the another embodiment, the average grain diameter of the ceramic grains forming the second ceramic substrate 12 is smaller than the average grain diameter of the ceramic grains forming the first ceramic substrate 11.

As described above, when the average grain diameter of the ceramic grains forming the first ceramic substrate 11 is set smaller than that of the ceramic grains forming the second ceramic substrate 12, the strength of the wall surface of the flow path 31 and the vicinity thereof can be improved. Hence, the heating medium may be allowed to flow through the flow path 31 at a high pressure. In addition, when the average grain diameter of the ceramic grains forming the second ceramic substrate 12 is set larger than that of the ceramic grains forming the first ceramic substrate 11, the thermal conductivity of the sample holding surface 10a and the vicinity thereof can be improved. As a result, the thermal uniformity of the sample holding surface 10a can be improved.

In particular, when the first ceramic substrate 11 and the second ceramic substrate 12 are each formed of aluminum oxide, the average grain diameter of the ceramic grains forming the first ceramic substrate 11 may be set, for example, to 0.5 to 10 μm. In addition, the average grain diameter of the ceramic grains forming the second ceramic substrate 12 may be set, for example, to 3 to 20 μm. In particular, it is preferable that the average grain diameter of the ceramic grains forming the first ceramic substrate 11 and the average grain diameter of the ceramic grains forming the second ceramic substrate 12 be set to 0.5 to 5 μm and 5 to 20 μm, respectively. Accordingly, the heating medium is allowed to flow through the flow path 31 at a high pressure, and at the same time, the thermal uniformity of the sample holding surface 10a can be improved.

In addition, in the case in which the first ceramic substrate 11 and the second ceramic substrate 12 are each formed of aluminum nitride, the average grain diameter of ceramic grains is preferably controlled as described above.

REFERENCE SIGNS LIST 1, 1A sample holder
10 base body
10a sample holding surface
11 first ceramic substrate
12 second ceramic substrate
31 flow path
31a, 31b opening portion
20 electrode
21 positive electrode
22 negative electrode
40 bonding layer

The invention claimed is:

1. A sample holder comprising:
   a first ceramic substrate including a flow path for a heating medium; and
   a second ceramic substrate laminated on the first ceramic substrate, having an upper surface functioning as a sample holding surface, and formed of the same material as that of the first ceramic substrate,
   a bonding layer interposed between the first ceramic substrate and the second ceramic substrate and bonding the first ceramic substrate and the second ceramic substrate,
   wherein the first ceramic substrate and the second ceramic substrate are formed of different material from the bonding layer, and an average grain diameter of ceramic grains forming the second ceramic substrate is different from an average grain diameter of ceramic grains forming the first ceramic substrate.

2. The sample holder according to claim 1, wherein the first ceramic substrate and the second ceramic substrate contain aluminum oxide as a primary component.

3. The sample holder according to claim 1, wherein the average grain diameter of the ceramic grains forming the second ceramic substrate is smaller than the average grain diameter of the ceramic grains forming the first ceramic substrate.

4. The sample holder according to claim 1, wherein the second ceramic substrate includes an electrostatically adsorbing electrode.

5. A sample holder according to claim 1, wherein the average grain diameter of ceramic grains forming the second ceramic substrate is larger than the average grain diameter of ceramic grains forming the first ceramic substrate.

6. The sample holder according to claim 1, wherein the average grain diameter of the ceramic grains forming the first ceramic substrate is 0.5 μm to 10 μm, and the average grain diameter of the ceramic grains forming the second ceramic substrate is 3 μm to 20 μm.

7. The sample holder according to claim 1, wherein the average grain diameter of the ceramic grains forming the first ceramic substrate is 3 μm to 20 μm, and the average grain diameter of the ceramic grains forming the second ceramic substrate is 0.5 μm to 5 μm.

* * * * *